United States Patent
Asa et al.

(10) Patent No.: US 8,540,473 B2
(45) Date of Patent: Sep. 24, 2013

(54) LOAD PORT

(75) Inventors: Fuminori Asa, Toyohashi (JP); Yasushi Taniyama, Toyohashi (JP)

(73) Assignee: Sinfonia Technology Co., Ltd., Tokyo (JP)

( * ) Notice: Subject to any disclaimer, the term of this patent is extended or adjusted under 35 U.S.C. 154(b) by 0 days.

(21) Appl. No.: 13/204,865

(22) Filed: Aug. 8, 2011

(65) Prior Publication Data
US 2012/0034051 A1 Feb. 9, 2012

(30) Foreign Application Priority Data

Aug. 7, 2010 (JP) ................................ 2010-178235

(51) Int. Cl.
*B65B 21/02* (2006.01)
(52) U.S. Cl.
USPC ............ 414/411; 414/217; 414/937; 414/938
(58) Field of Classification Search
USPC .................. 414/411, 416.01, 416.02, 416.08, 414/937, 938, 217.1, 217
See application file for complete search history.

(56) References Cited

U.S. PATENT DOCUMENTS

| | | | |
|---|---|---|---|
| 5,449,289 A | 9/1995 | Owczarz et al. | |
| 6,447,233 B1 | 9/2002 | Denker | |
| 7,523,769 B2 | 4/2009 | Miyajima et al. | |
| 2006/0088406 A1* | 4/2006 | Miyajima et al. | 414/805 |
| 2011/0005868 A1 | 1/2011 | Suzuki et al. | |
| 2012/0000816 A1 | 1/2012 | Bonora | |

FOREIGN PATENT DOCUMENTS

| | | |
|---|---|---|
| JP | 2009-070868 | 4/2009 |
| WO | WO 2012/003240 A2 | 1/2012 |
| WO | WO 2012/003240 A3 | 1/2012 |

* cited by examiner

*Primary Examiner* — Saul Rodriguez
*Assistant Examiner* — Willie Berry, Jr.
(74) *Attorney, Agent, or Firm* — Oblon, Spivak, McClelland, Maier & Neustadt, L.L.P.

(57) ABSTRACT

A load port including a frame having an opening, a vessel receiving table that receives the wafer vessel, a door removably attached to the opening, a door opening and closing mechanism that opens and closes the door, and a closing mechanism that exerts force on the door when the door opening and closing mechanism closes the door.

7 Claims, 2 Drawing Sheets

LOAD PORT

CROSS REFERENCE TO RELATED APPLICATION

This application claims priority to Japanese Application Number 2010-178235, filed Aug. 7, 2010, the entire contents of which are hereby incorporated by reference.

BACKGROUND OF THE INVENTION

1. Field of the Invention

This invention relates to a load port used to transfer a wafer from and into a wafer accommodating vessel such as a FOUP (Front-Opening Unified Pod), a MAC (Multi Application Carrier) or a FOSB (Front Open Shipping Box) upon semiconductor manufacture.

2. Description of the Related Art

In a manufacturing process of semiconductors, a wafer is processed in a clean room in order to assure an enhanced yield and enhanced quality. However, in these days in which high integration of devices, miniaturization of circuits and increase in size of wafers have proceeded, it is difficult to manage fine dust in the inside of the overall clean room from a point of view of the cost and the technology. Therefore, as a method which replaces enhancement in cleanness of the inside of the overall clean room, a countermeasure is taken which adopts a "minienvironment system" which enhances the cleanness only in a local space around a wafer to carry out transportation and other processes of wafers. In the minienvironment system, in order to transport and accommodate a wafer in a highly clean environment, a wafer accommodating vessel for exclusive use is utilized. In order to transfer a wafer between a wafer accommodating vessel and a semiconductor manufacturing apparatus, an interface called a load port is utilized.

Particularly in recent years, increase in size of wafers has advanced, and recently, also formulation of peripheral apparatus for wafers of a diameter of 450 mm has been progressed. As wafer accommodating vessels, a FOUP, a MAC including an H-MAC (Horizontal-MAC), a FOSB and so forth are available. The wafer accommodating vessels listed above have a common structure in that they include a door provided for one of upright faces such that it can be opened and closed and can close up the wafer accommodating vessel. The door is opened and closed by a door opening and closing mechanism provided on a load port in a state in which the wafer accommodating vessel is placed on a vessel receiving table of the load port. When the door is in an open state, a wafer is carried into or out of the wafer accommodating vessel by a transport robot provided on an EFEM (Equipment Front End Module) on which the load port is provided.

The load port includes, as a mechanism for opening and closing a door of a wafer accommodating vessel (the door is hereinafter referred to as "vessel door"), a door member for holding the vessel door in a closely contacting state to open and close the vessel door. The mechanism of the load port further includes a post-like support member for supporting the door member, and a door opening and closing mechanism for moving the door member toward and away from the wafer accommodating vessel together with the support member and moving the door member upwardly and downwardly together with the support member. The door member is disposed such that it just fits with an aperture section formed in a frame section in the form of a plate of the load port which configures part of an outer wall of an EFEM. When the vessel door is to be placed into an open state, the door opening and closing mechanism is rendered operative to retract the door member, which holds the vessel door in a closely contacting state, and the support member away from the wafer accommodating vessel (toward the internal space of the EFEM) once and then downwardly. When the vessel door is to be placed into a closed state, the associated members operate in the reverse procedure.

On the other hand, the wafer accommodating vessel can accommodate a plurality of wafers in a plurality of stages disposed upwardly and downwardly relative to each other. However, in order to accommodate the wafers stably, a retainer capable of retaining a wafer in each of the stages by elastic force is provided on an inwardly directed face of the vessel door (refer to Japanese Patent Laid-Open No. 2008-135434). The retainer is configured in the following manner. In particular, it has elasticity and presses and retains a wafer in the wafer accommodating vessel from the inner face side of the vessel door while it is elastically deformed so that the wafer is positioned at its accommodated position and damage to the wafer, which is thin and fragile, can be prevented.

SUMMARY OF THE INVENTION

Incidentally, as such increase of the diameter of a wafer as described above proceeds, it becomes necessary to retain a wafer stably in a wafer accommodating vessel, and to this end, it becomes necessary to increase the elastic force of a retainer provided on a vessel door. This in turn increases the size also of the vessel door and the door member of the load port and increases the weight of them as well.

From such a situation as just described, if it is tried to use a vessel door opening and closing mechanism at present to raise the door member of the load port to place the vessel door, which is in an open state, into a closed state, then there is the possibility that the vessel door may not be moved to a position at which the wafer accommodating vessel is placed into a tightly closed state because the door member is engaged with the aperture section formed in the frame section of the load port due to the high elastic force of the retainer. Further, since the door member of the load port is configured such that it is supported from below by the post-like support member, the door member which holds the vessel door thereon tends to be tilted in a direction toward the inside of the EFEM together with the support member, which is deformed around a fulcrum provided by the lower end side thereof, by the weight of the vessel door, which is not closed up fully, and the weight of the door member. In other words, in the load port, a gap appears between the door member and the aperture section. Since this gap is notable particularly between an upper end portion of the door member and an opening upper edge of the aperture section, the vessel door is spaced further away from the wafer accommodating vessel. Consequently, it is considered that this makes it still more difficult to tightly close the wafer accommodating vessel.

One of solutions to such a problem as just described is to increase the driving force of the door opening and closing mechanism. However, to this end, it becomes necessary to apply a motor of higher output power. Therefore, it is desirable to provide a load port which can solve the problem of the difficulty in tight closure of a wafer accommodating vessel caused by increase of the diameter of a wafer without changing the driving source of a door opening and closing mechanism.

According to the present invention, there is provided a load port serving as an interface for transfer of a wafer between a wafer accommodating vessel, which includes a vessel door mounted for opening and closing movement and for closing up operation of the wafer accommodating vessel, and a semiconductor manufacturing apparatus, including a plate-like frame section disposed in an upright state and configuring a main body section of the load port, a vessel receiving table extending in a substantially horizontal direction from the frame section, a door member removably mounted on an aperture section formed on the frame section and capable of holding thereon the vessel door of a wafer accommodating vessel placed on the vessel receiving table, a door opening and closing mechanism for moving the door member between a position at which the door member is retracted from the aperture section together with the vessel door to open the wafer accommodating vessel and the aperture section and another position at which the aperture section is closed up to tightly close the wafer accommodating vessel with the vessel door to tightly close the wafer accommodating vessel, and a compulsory closing mechanism for moving, in a process of a closing operation of the door member by the door opening and closing mechanism, the door member positioned in the proximity of the aperture section to a position at which the door member fully closes up the aperture section.

If increase of the elastic force of a retainer of a vessel door or increase in size or weight of the vessel door or a door member of a load port arising from increase in diameter of a wafer causes an existing door opening and closing mechanism to fail in full closure of an aperture section of a frame section of the load with the door member, then such a situation that the wafer accommodating vessel cannot be tightly closed by the vessel door occurs. However, with the load port according to the present invention, if such a situation occurs, then the compulsory closing mechanism is rendered operative. By the operation of the compulsory closing mechanism, the door member can be compulsory moved to the position in which it closes up the aperture section of the frame section, and besides the wafer accommodating vessel can be tightly closed by the vessel door. Consequently, by additionally providing an existing load port with the compulsory closing mechanism, the load port can be made suitable for transfer of a wafer between the wafer accommodating vessel, to which a wafer of a large diameter is applied, and the semiconductor manufacturing apparatus without modifying an existing door opening and closing mechanism.

With the load port of the present invention, the problem of the difficulty in tight closing of the wafer accommodating vessel which arises from increase in diameter of a wafer can be eliminated by the countermeasure of adding a mechanism for compulsory closing up the door member of the load port while an existing door opening and closing mechanism or the like is utilized as it is.

The above and other objects, features and advantages of the present invention will become apparent from the following description and the appended claims, taken in conjunction with the accompanying drawings in which like parts or elements denoted by like reference symbols.

DETAILED DESCRIPTION OF THE PREFERRED EMBODIMENT

In the following, an embodiment of the present invention is described with reference to the accompanying drawings.

Figure 1:
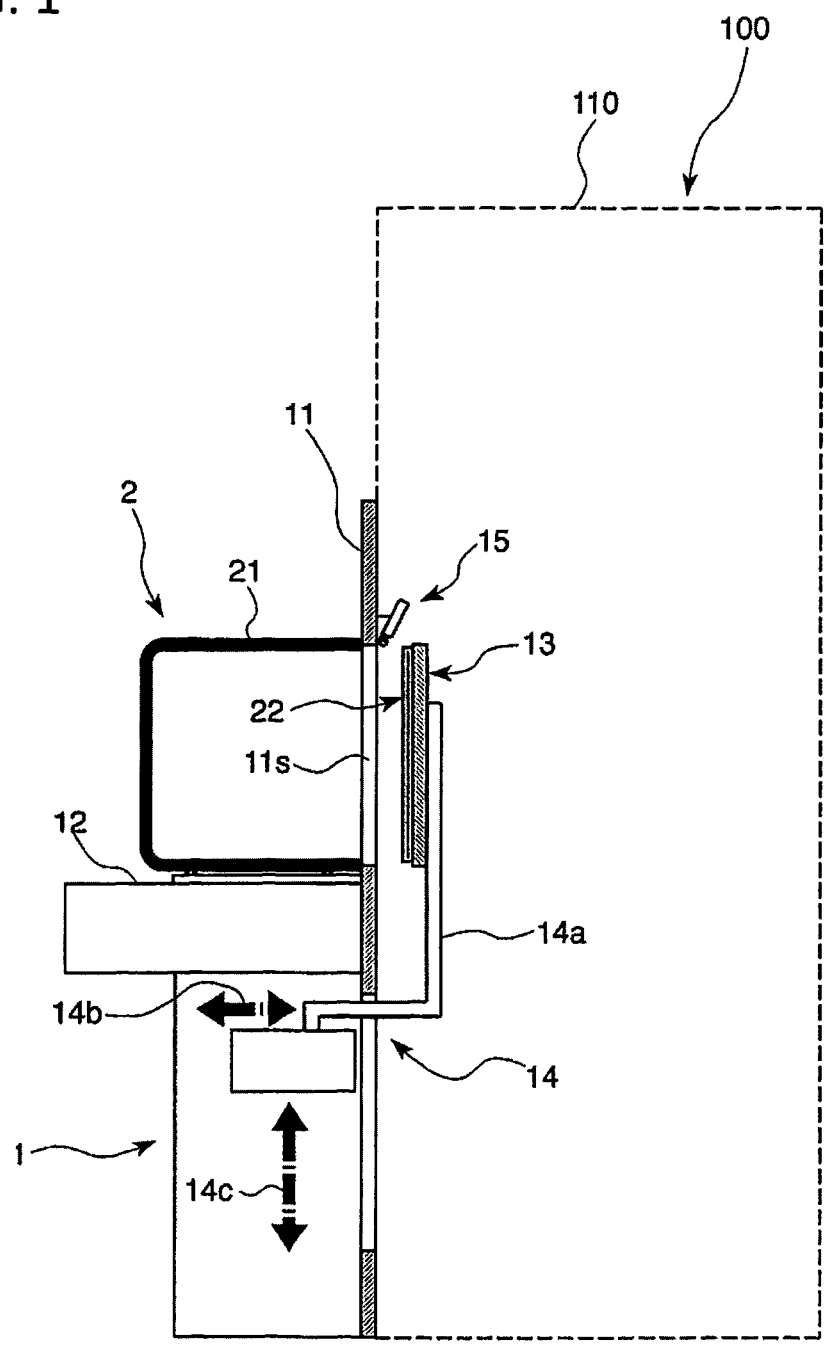
FIG. 1 is a schematic view showing a general configuration of a load port according to an embodiment of the present invention.

FIG. 1 schematically shows a load port 1 according to the embodiment of the present invention. Referring to FIG. 1, the load port 1 shown configures an EFEM (Equipment Front End Module) 100, which is disposed adjacent a semiconductor manufacturing apparatus not shown, together with a wafer transporting apparatus 110 in which a wafer transporting robot not shown and so forth are installed. The load port 1 functions as an interface for transferring a wafer not shown between the inside of a wafer accommodating vessel 2 and the semiconductor manufacturing apparatus. The wafer accommodating vessel 2 is configured from a vessel which complies with predetermined standards such as a FOUP (Front-Opening Unified Pod), an H-MAC (Horizontal-MAC) or a FOSB (Front Open Shipping Box). The load port 1 of the present embodiment is ready for transfer of a wafer into and from the wafer accommodating vessel 2 which is one of the vessels mentioned above.

The wafer accommodating vessel 2 includes, as principal components thereof, a vessel main body 21 which is open on one side thereof which opposes to the load port 1, and a vessel door 22 removably fitted with the aperture section of the vessel main body 21 for tightly closing the vessel main body 21. The vessel main body 21 has a plurality of partitions provided in a plurality of stages in a heightwise direction such that one wafer is placed in each of the stages. The vessel door 22 has a retainer not shown provided for each of the stages of the vessel main body 21. The retainer is formed from an elastic member such as a leaf spring and elastically presses a wafer when the vessel door 22 is closed. Consequently, the wafer accommodating vessel 2 itself can be transported in a state in which wafers are accommodated stably by the retainers.

The load port 1 includes such basic components as described below. In particular, the load port 1 includes a frame section 11 having a substantially rectangular shape and disposed in a substantially vertically extending posture. The load port 1 further includes a vessel receiving table 12 provided in a substantially horizontally extending posture at a position displaced a little upwardly from a central portion of the frame section 11 in the heightwise direction. The load port 1 further includes a door member 13 disposed corresponding to an aperture section 11s of the frame section 11 whose opening lower edge is set to a heightwise position substantially same as that of the vessel receiving table 12. The load port 1 further includes a door opening and closing mechanism 14 for moving the door member 13 between a position at which the door member 13 closes up the aperture section 11s and another position at which the door member 13 opens the aperture section 11s. The load port 1 of the present embodiment further includes a compulsory closing mechanism 15 in order to compulsory closing up the aperture section 11s with the door member 13.

The basic components of the load port 1 will be briefly described. The frame section 11 configures part of a front wall or a side wall of the wafer transporting apparatus 110 of the EFEM 100. The vessel receiving table 12 receives a wafer accommodating vessel 2 transported thereto by a vessel transporting apparatus not shown such that the vessel door 22 contacts closely with the door member 13. The door member 13 is disposed such that it closes up the aperture section 11s of the frame section 11. However, when a wafer is to be transferred into and from the vessel main body 21 of the wafer accommodating vessel 2, the door member 13 is closely contacted with and holds the vessel door 22 thereon and then is spaced away from the aperture section 11s by the door opening and closing mechanism 14 to open the vessel main body 21. The door opening and closing mechanism 14 includes, as a principal component thereof, a support member 14a in the form of a post having an L shape as viewed in side elevation for supporting the door member 13 from below. The door opening and closing mechanism 14 further includes, as another principal component thereof, a horizontally sliding apparatus 14b for moving the support member 14a in directions, horizontal directions in the present embodiment, toward and away from the wafer accommodating vessel 2 together with the door member 13 which holds the vessel main body 21. The door opening and closing mechanism 14 further includes, as a further principal component thereof, an upwardly and downwardly sliding apparatus 14c for moving the door opening and closing mechanism 14 in upward and downward directions.

In particular, the load port 1 of the present embodiment is configured in the following manner. In particular, when a wafer is to be transferred between a wafer accommodating vessel 2 and the semiconductor manufacturing apparatus, the vessel door 22 is closely contacted with and held by the door member 13. Then, the support member 14a is moved into the internal space side of the wafer transporting apparatus 110 in a direction in which the support member 14a is spaced away from the vessel main body 21 and the frame section 11 together with the door member 13, which holds the vessel main body 21, by the horizontally sliding apparatus 14b. Further, the support member 14a is retracted downwardly by the upwardly and downwardly sliding apparatus 14c to a position at which the internal space of the vessel main body 21 is communicated fully with the wafer transporting apparatus 110 through the aperture section 11s. On the other hand, when processing of the wafers by the semiconductor manufacturing apparatus is completed and all of the wafers are accommodated into the vessel main body 21, the support member 14a is moved up by the upwardly and downwardly sliding apparatus 14c to move up the door member 13 and vessel door 22, which have been retracted downwardly, to a heightwise position at which the door member 13 of the support member 14a is aligned with the aperture section 11s. Then, the support member 14a is further moved toward the frame section 11 side by the horizontally sliding apparatus 14b to close up the aperture section 11s with the door member 13 and tightly close the vessel main body 21 with the vessel door 22.

Figure 3:
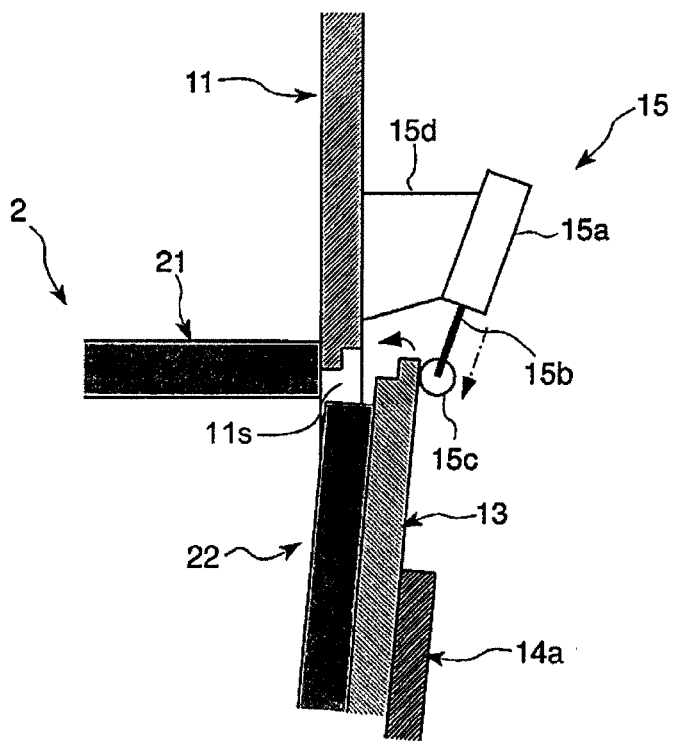
FIG. 3 is a similar view but illustrating operation of the compulsory closing mechanism.

However, if the wafer accommodating vessel 2 is configured so as to accommodate a wafer of a comparatively large diameter therein, then a retainer having comparatively high elastic force is applied for retaining a wafer stably. Further, the vessel door 22 and the door member 13 are configured in a comparatively large size ready for such wafers. Therefore, in this instance, even if it is tried to close up the aperture section 11b with the door member 13 by means of the door opening and closing mechanism 14 and tightly close the wafer accommodating vessel 2 with the vessel door 22, the elastic force of the retainers cannot be overcome and the door member 13 which holds the vessel door 22 thereon tends to be tilted to the inner side of the wafer transporting apparatus 110 together with the support member 14a. As a result, the door member 13 may not close up the aperture section 11b, and the vessel door 22 may not tightly close the vessel main body 21 as schematically illustrated in FIG. 3. In other words, a state in which a gap appears between the door member 13 and the aperture section 11s and cannot be fully removed by the driving force of the door opening and closing mechanism 14 to close up the aperture section 11s with the door member 13 may possibly occur in a procedure of the closing operation of the door member 13 and the vessel door 22. Since the door member 13 is configured so as to be supported from below by the support member 14a, the support member 14a is deformed by a comparatively great amount on the upper end side thereof around a fulcrum provided by the lower end side thereof. Consequently, the gap between the door member 13 and the aperture section 11s indicates a notably great amount between the upper end portion side of the door member 13 and the opening upper edge of the aperture section 11s.

Figure 2:
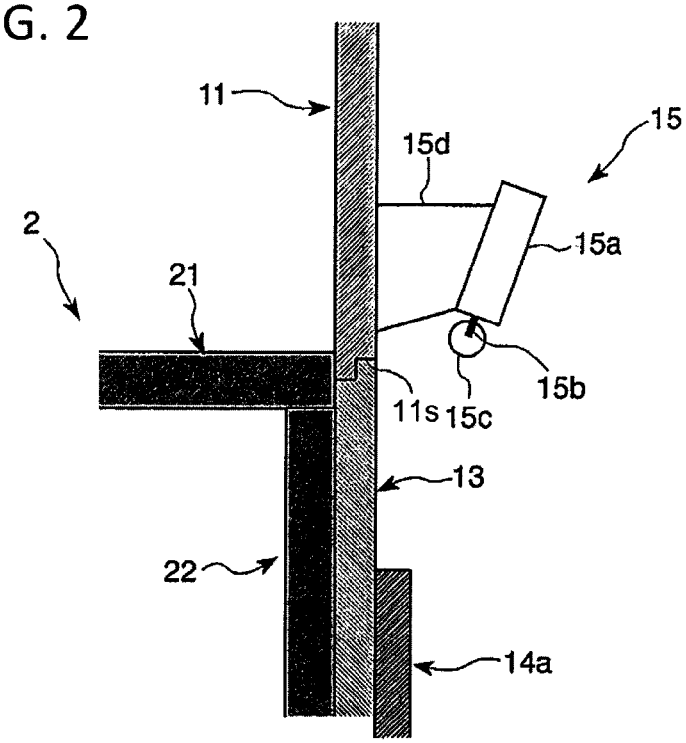
FIG. 2 is an enlarged view schematically showing a compulsory closing mechanism and associated elements of the load port of FIG. 1.

Therefore, in the present embodiment, the compulsory closing mechanism 15 is provided as a mechanism for compulsory moving the door member 13 in a state in which it does not fully close up the aperture section 11s to a position at which the door member 13 fully closes up the aperture section 11s. The compulsory closing mechanism 15 includes, as a principal component thereof, a cylinder 15a disposed a little above the opening upper edge of the aperture section 11s on a side wall of the frame section 11 adjacent the wafer transporting apparatus 110. The compulsory closing mechanism 15 further includes, as principal components thereof, a rod 15b mounted for movement from and into the cylinder 15a, and a roller 15c provided for rotation at an end portion of the rod 15b. The cylinder 15a is attached to a pedestal 15d disposed in an inclined relationship on the frame section 11 such that the roller 15c can be pressed suitably against the door member 13 which is partly open. An actuator not shown is connected to the cylinder 15a such that, when the door member 13 comes close to the aperture section 11s upon closing operation of the door member 13 by the door opening and closing mechanism 14, the actuator is rendered operative to extend the rod 15b. Thereupon, the roller 15c at the end portion of the rod 15b rides on an upper end portion of the door member 13 to press the door member 13 against the aperture section 11s side so that the aperture section 11s can be fully closed up with the door member 13. As a result, the vessel door 22 held by the door member 13 can close up the vessel main body 21, and tight closing of the wafer accommodating vessel 2 is implemented thereby. After the wafer accommodating vessel 2 is tightly closed, as shown in FIG. 2, the actuator is rendered operative again to retract the rod 15b to the cylinder 15a side together with the roller 15c.

As described above, in the load port 1 of the present embodiment, by providing the compulsory closing mechanism 15 for pressing the door member 13 against the aperture section 11s side of the frame section 11 without modifying the existing the door opening and closing mechanism 14, the problem of the difficulty in tight closing of the wafer accommodating vessel 2 which arises from increase in diameter of a wafer can be eliminated.

It is to be noted that the present embodiment is not limited to the embodiment described above. In particular, the compulsory closing mechanism is not limited to that of the configuration described above but may be formed adopting any suitable configuration only if it can fully close up the aperture section with the door member which moves to the proximity of the aperture section during a closing process. For example, not only a configuration which presses the door member against the aperture section side, but also a configuration which draws the door member into the aperture section side may be adopted. Further, it is advantageous for the compulsory closing mechanism to have a configuration which pushes or draws an upper end portion of the door member to move toward the aperture section side since the gap between the upper end portion of the door member and the opening upper edge of the aperture section is great because the support member is deformed around a fulcrum provided by the lower end side thereof. However, also it is possible to adopt another configuration which moves some other portion of the door member toward the aperture section side or to provide a plurality of compulsory closing mechanisms. Further, a load port which includes any of such compulsory closing mechanisms can be utilized also for closing up the wafer accommodating vessel 2, to which a wafer of a popular size is applied, with a higher degree of certainty. Furthermore, the compulsory closing mechanism in the present embodiment can be applied also to a POD or BOX opener. Also the other particular components are not limited to those of the embodiment described above but can be modified in various forms without departing from the spirit and scope of the present invention.

It should be understood by those skilled in the art that various modifications, combinations, sub-combinations and alterations may occur depending on design requirements and other factor in so far as they are within the scope of the appended claims or the equivalents thereof.

What is claimed is:

1. A load port comprising:
a frame having an opening;
a vessel receiving table extending from the frame and configured to receive a wafer vessel;
a door removably attached to the opening of the frame and configured to hold a vessel door of the wafer vessel;
a door opening and closing mechanism configured to move the door and the vessel door between an open position in which the door is detached from the opening of the frame and the vessel door is detached from the wafer vessel, and a closed position in which the door is attached to the opening of the frame and the vessel door is attached to the wafer vessel; and
a compulsory closing mechanism configured to exert force on the door in a direction of the opening of the frame when the door opening and closing mechanism moves the door into the fully closed position, wherein:
the compulsory closing mechanism includes a cylinder provided above an upper edge of the opening of the frame, a rod movable from and into the cylinder and a roller configured to push an upper portion of the door toward the opening of the frame, and
the roller is configured to directly contact the door when pushing the upper portion of the door toward the opening of the frame.

2. The load port according to claim 1, wherein:
the compulsory closing mechanism pushes or draws an upper portion of the door toward the opening of the frame.

3. The load port according to claim 1, wherein:
the force exerted by the compulsory closing mechanism on the door is greater than an elastic force of a retainer holding a wafer inside the wafer vessel.

4. The load port according to claim 1, wherein:
the cylinder and the rod are provided in an inclined relationship with the frame.

5. The load port according to claim 1, wherein:
the door opening and closing mechanism and the compulsory closing mechanism are disposed on opposite sides of the frame.

6. The load port according to claim 1, wherein:
the door opening and closing mechanism is structurally independent of the compulsory closing mechanism.

7. A load port comprising:
a frame having an opening;
a vessel receiving table extending from the frame and configured to receive a wafer vessel;
a door removably attached to the opening of the frame and configured to hold a vessel door of the wafer vessel;
means for moving the door and the vessel door between an open position in which the door is detached from the opening of the frame and the vessel door is detached from the wafer vessel, and a closed position in which the door is attached to the opening of the frame and the vessel door is attached to the wafer vessel; and
means for compulsory exerting force on the door in a direction of the opening of the frame when the means for moving moves the door into the fully closed position, wherein:
the means for compulsory exerting force on the door includes a cylinder provided above an upper edge of the opening of the frame, a rod movable from and into the cylinder and a roller configured to push an upper portion of the door toward the opening of the frame, and
the roller is configured to directly contact the door when pushing the upper portion of the door toward the opening of the frame.

* * * * *